United States Patent [19]

Kimock et al.

[11] Patent Number: 5,643,423

[45] Date of Patent: Jul. 1, 1997

[54] METHOD FOR PRODUCING AN ABRASION RESISTANT COATED SUBSTRATE PRODUCT

[75] Inventors: Fred M. Kimock, Macungie; Bradley J. Knapp; Steven James Finke, both of Kutztown, all of Pa.

[73] Assignee: Monsanto Company, St. Louis, Mo.

[21] Appl. No.: 161,896

[22] Filed: Dec. 3, 1993

Related U.S. Application Data

[60] Division of Ser. No. 924,297, Aug. 3, 1992, Pat. No. 5,268,217, which is a continuation-in-part of Ser. No. 589,447, Sep. 27, 1990, Pat. No. 5,135,808.

[51] Int. Cl.$^6$ .................................................. C23C 14/00
[52] U.S. Cl. ................. 204/192.35; 204/192.36; 427/164; 427/166; 427/167; 427/249; 427/250; 427/255.7; 427/294; 427/299; 427/309; 427/398.4; 427/534
[58] Field of Search .................................. 427/164, 166, 427/167, 249, 250, 255.7, 398.4, 299, 309, 294, 534; 204/192.34, 192.35, 192.36

[56] References Cited

U.S. PATENT DOCUMENTS

| | | | |
|---|---|---|---|
| 4,060,660 | 11/1977 | Carlson et al. | 427/39 |
| 4,383,728 | 5/1983 | Litington | 350/1.7 |
| 4,400,410 | 8/1983 | Green et al. | 427/39 |
| 4,504,519 | 3/1985 | Zelez | 427/39 |
| 4,569,738 | 2/1986 | Kieser et al. | 204/173 |
| 4,603,082 | 7/1986 | Zelez | 428/336 |
| 4,661,409 | 4/1987 | Kieser et al. | 428/408 |
| 4,746,538 | 5/1988 | Mackowski | 427/38 |
| 4,877,677 | 10/1989 | Hirochi et al. | 428/216 |
| 4,907,846 | 3/1990 | Tustison et al. | 350/1.6 |
| 5,235,168 | 8/1993 | Bobba | 235/462 |

FOREIGN PATENT DOCUMENTS

| | | |
|---|---|---|
| 243451 | 5/1987 | European Pat. Off. |
| 203903 | 11/1983 | Germany |
| 42 01 914 A1 | 7/1992 | Germany |
| 51-128686 | 11/1976 | Japan |
| 59-26906 | 2/1984 | Japan |
| 63-195266 | 8/1988 | Japan |
| 63-221840 | 9/1988 | Japan |
| 63-221841 | 9/1988 | Japan |
| 64-2001 | 1/1989 | Japan |
| 1-147067 | 6/1989 | Japan |
| 1-147068 | 6/1989 | Japan |
| 1006402 | 3/1983 | U.S.S.R. |

OTHER PUBLICATIONS

Bubenzer, et al., Proc. DARPA Workshop DLB Coat. (1982) issue date AD-A136766, 33–47, editor B. Bendow (no month available).

Stein, et al., NBS Spec. Publ. 638, 482–488 (1984) (no month available).

Bubenzer, et al., NBS Spec. Publ. 638, 477–481 (1984) (no month available).

Liou, et al., Appl. Phys. Lett., 55, 631–633 (1989) (no month available).

Franks, J. Vac. Sci. Technol., A7, 2307–2310 (1989) (no month available).

Nir, Thin Solid Films, 144, 201–209 (1986) (no month available).

(List continued on next page.)

*Primary Examiner*—Bernard Pianalto
*Attorney, Agent, or Firm*—Coudert Brothers

[57] ABSTRACT

The coated substrate product finds particular application in eyeglass and sunglass lenses, architectural glass, analytical instrument windows, automotive windshields and laser bar code scanners for use in retail stores and supermarkets. The product has greatly improved wear resistance for severe abrasive environments and comprises a substantially optically transparent substrate, a chemically vapor deposited first interlayer bonded to the substrate and a chemically vapor deposited outer layer of substantially optically transparent diamond-like carbon bonded to the interlayer and away from the substrate.

70 Claims, 2 Drawing Sheets

OTHER PUBLICATIONS

Deutchman, et al., Proc. SPIE Int. Soc. Opt. Eng. 1146, 124–34 (1989) (no month available).

Collins, et al., Proc. SPIE Int. Soc. Opt. Eng. 1146, 37–47 (1989) (no month available).

Liou, et al., Proc. SPIE Int. Soc. Opt. Eng. 1146, 12–20 (No date).

Final Program of American Vacuum Society 37th Annual Symposium in Toronto, Canada, cover & pp. 66–67 (Oct.. 8–12, 1990).

Paper from aforementioned symposium: Saumel J. Holmes and V. Warren Ciricik, "Optical Properties and Intrinsic Coating Stresses In Ion Beam Sputter Deposited Silicon Oxynitride Films", Northrop Research and Technology Center (Oct. 8, 1990).

METHOD FOR PRODUCING AN ABRASION RESISTANT COATED SUBSTRATE PRODUCT this application is a division of application U.S. Ser. No. 07/924,297, filed Aug. 1992, now U.S. Pat. No. 5,268,217, issued Dec. 3, 1993 (Docket No. 52006), which patent is a Continuation-in-Part of application U.S. Ser. No. 07/589,447, filed Sep. 27, 1990, now U.S. Pat. No. 5,135,808, issued Aug. 4, 1992.

FIELD OF THE INVENTION

This invention relates generally to coated substrate products. More particularly, the invention relates to a substantially optically transparent coated substrate product comprised of a parent substrate, one or more interlayers and a diamond-like carbon layer, and to a method for producing same.

BACKGROUND OF THE INVENTION

The properties of glass make it an ideal substrate material for use in many applications. In particular, the combination of optical transparency, with reasonable strength at a nominal cost, allows the widespread use of glass products. Glass, however, does suffer from several limitations. Glass is not a particularly hard material, and consequently it abrades in many applications. Additionally, glass is chemically reactive with many alkaline substances and with hydrofluoric acid. New applications and superior performance in existing applications could be thus realized for glass products if glass were more abrasion resistant and less chemically reactive. Examples of glass products which could benefit from improved abrasion resistance include eyeglass and sunglass lenses, architectural glass, analytical instrument windows, automotive windshields and laser bar code scanners for use in retail stores and supermarkets.

Diamond-like carbon films (DLC) are well known in the art and have been recognized as potential coatings to enhance the abrasion resistance of various substrate materials, including glass. The DLC coatings possess excellent optical properties and exhibit excellent resistance to abrasion and chemical attack by various acids, including hydrofluoric acid. However, it has been found that the DLC coatings will impart improved abrasion resistance to a substrate only if the adherence of the coating to the parent substrate is excellent.

The most obvious and common approach to coating the glass substrate is to apply the DLC coating directly onto a clean glass surface. However, this approach often results in a DLC coating which displays poor adhesion and therefore, poor abrasion resistance. DLC coatings are typically under significant compressive stress. This stress greatly affects the ability of the coating to remain adherent to the glass substrate. Additionally, glass often contains many alkali oxides and other additives which can inhibit the bonding of the $SiO_2$ in the glass to the carbon atoms in the DLC coating. It is currently believed that the reaction between the $SiO_2$ in glass and the DLC is essential for the coating to exhibit excellent adhesion. Therefore, less obvious methods are required to produce a glass substrate with a highly adherent DLC coating which provides excellent abrasion resistance.

In addition to glass substrates, many other optically transparent substrate materials, such as sapphire, glassy-ceramics, salts (NaCl, KBr, KCl, etc.), metal fluorides and metal oxides could benefit from a DLC coating, but contain elements which inhibit the bonding of the DLC layer.

Many methods for depositing DLC have been demonstrated, including radio frequency plasma deposition, ion beam sputter deposition from a carbon target, ion beam sputtered carbon with ion beam assist, direct ion beam deposition, dual ion beam deposition, laser ablation deposition from a carbon target, and ion beam assisted evaporation of carbon. Many of these prior art techniques have been used to deposit DLC on glass substrates, however, the emphasis of the prior art has not been on the adhesion of the DLC to the glass substrate or on the abrasion resistance of the coated substrate product. Illustrative are the following references: U.S. Pat. Nos. 4,746,538; 4,400,410; 4,383,728; 4,504,519; 4,603,082; 4,060,660; 4,877,677; 4,569,738 and 4,661,409; Japanese Patent Nos. 63/221841; 63/221840; 63/195266; 1147068; 1147067; 64–2001; 59-26906 and 51128686; European Patent Nos. DD-203903; SU1006402; European Patent Application #EPO 243541 (WO 87/02713); Deutchman, et al.; Proc. SPIE-Int. Soc. Opt. Eng.1146, 124–34, 1989; Collins, et at., Proc. SPIE-Int. Soc. Opt. Eng. 1146, 37–47, 1989; Liou, et al., Proc. PIE-Int. Soc. Opt. Eng. 1146, 12–20, 1989; Bubenzer, et al., Proc. DARPA Workshop Diamond-Like Carbon Coat., Meeting date 1982, Issue AD-A136 766, 33–47, edited by B. Bendow in NBS Spec. Publ. 669, 249–54, 1984; NBS Spec. Publ. 638, 482–82, 1984; Bubenzer, et al., NBS Spec. Publ. 638, 477–81, 1984; Appl. Phys. Lett. 55, 631–3, 1989; J. Vac. Sci. Technol A7, 2307–10, 1989; and D. Nir, Thin Solid Films, 144, 201–9, 1986. These references do not however describe the use of transparent interlayers to improve the adhesion of the amorphous carbon coating to the substrate or substantially optically transparent DLC coatings with greatly improved wear resistance for severe abrasive environments.

SUMMARY OF THE INVENTION

This invention provides a coated substrate product with superior abrasion wear resistance and reduced chemical reactivity. More particularly, this invention provides a diamond-like carbon coating to the surface of an optically transparent substrate which is highly adherent and exhibits greatly improved wear resistance for severe abrasive environments. Still more particularly, this invention provides a coated substrate with improved ease of cleaning. This invention also provides a low cost and efficient process for producing a coated substrate product with superior abrasion wear resistance.

The disclosed abrasion wear resistant coated substrate product substantially reduces or eliminates the disadvantages and shortcomings associated with the prior art techniques. The invention discloses a substantially optically transparent composite structure which comprises a parent substrate, one or more intermediate layers and a diamond-like carbon layer in which at least one of the intermediate layers has thickness in the range of about 1 micron μm) to about 20 μm. The invention also discloses a method for fabricating the coated substrate product.

According to the method, the substrate surface is initially chemically de-greased. In the second step, the substrate surface is bombarded with energetic gas ions to assist in the removal of residual hydrocarbons, as well as alkali metals and other additives. After the substrate surface has been sputter-etched, one or more interlayers are chemically vapor deposited on the substrate, followed by the deposition of a diamond-like carbon layer. Once the requisite number of interlayers and diamond-like carbon layers have been deposited, the coated substrate is cooled and removed from the reactor.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same parts or elements throughout the views, and in which.

DETAILED DESCRIPTION OF THE INVENTION

Figure 1:
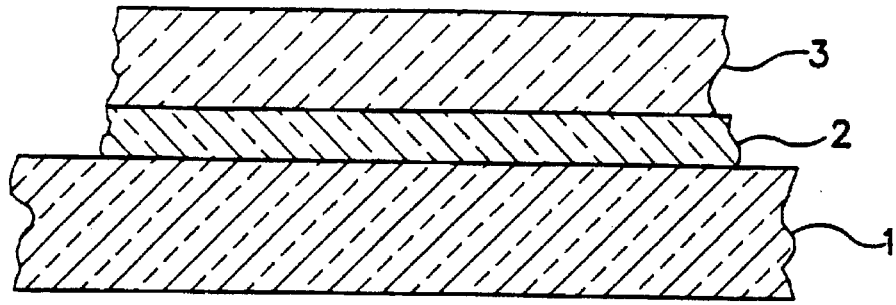
FIG. 1 is a cross-sectional view of the coated substrate product in accordance with the present invention.
Figure 2:
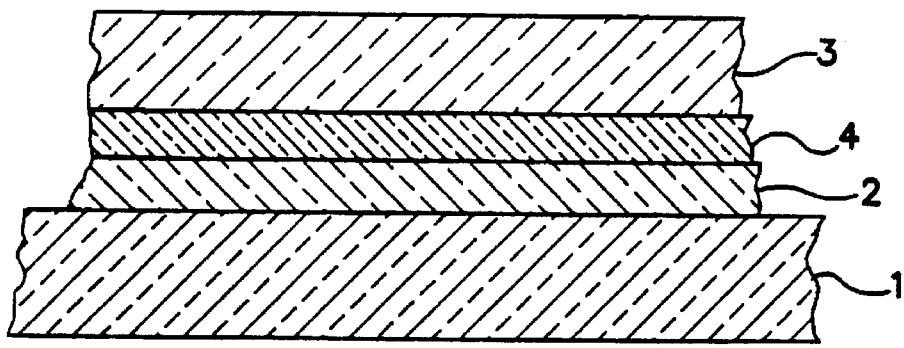
FIG. 2 is a cross-sectional view of the coated substrate product in accordance with a further embodiment of the present invention.
Figure 3:
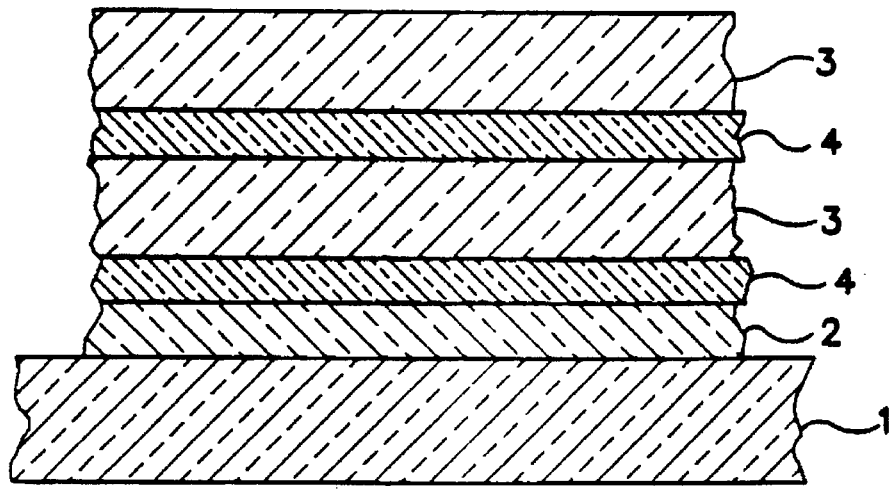
FIG. 3 is a cross-sectional view of the coated substrate product in accordance with a still further embodiment of the present invention.

In accordance with the present invention, the disclosed abrasion wear resistant coated substrate product substantially reduces or eliminates the disadvantages and shortcomings associated with the prior art techniques. As illustrated in FIGS. 1–3, the disclosed invention is a substantially optically transparent composite structure which comprises a parent substrate, one or more intermediate layers (interlayers) and a diamond-like carbon layer. By the term of "substantially optically transparent", it is intended to mean transparent to light in the visible region of the electromagnetic spectrum, which is generally between 350 nanometers and approximately 750 nanometers wavelength. A highly important technical advantage of the invention is that the resultant multilayer composite structure produces a highly abrasion wear resistant surface on various substrate materials, particularly glass.

In the preferred embodiment form of the invention, as illustrated in FIG. 1, a first interlayer 2 (or adhesion-mediating layer) is chemically vapor deposited onto a parent substrate 1 which comprises a substantially optically transparent amorphous material, a single crystal, polycrystalline materials, glass, salt materials, ceramic materials and/or mixtures thereof. By the term of "chemically vapor deposited", it is intended to mean materials deposited by vacuum deposition processes, including thermal evaporation, electron beam evaporation, magnetron sputtering, ion beam sputtering from solid precursor materials; thermally-activated deposition from reactive gaseous precursor materials; glow discharge, plasma, or ion beam deposition from gaseous precursor materials. Preferably, the first interlayer 2 is deposited onto the parent substrate 1 by ion beam or magnetron sputtering.

Atmospheric pressure deposition methods including arc-spray or plasma-spray deposition from gaseous or solid precursor materials, or thermally-activated deposition from reactive gaseous precursor materials may additionally be employed to deposit the first interlayer 2.

The first interlayer 2 generally comprises a substantially optically transparent material devoid of alkali metal atoms and fluorine, and capable of forming a strong chemical bond to the substrate 1 and the diamond-like carbon layer 3. By the term of "strong chemical bond", it is intended to mean that the interlayer is composed of a significant amount of an element or elements which are capable of undergoing a chemical reaction with carbon to form carbide-bonding. The absence of alkali metals and fluorine is essential to achieve a highly adherent interface between the first interlayer 2 and the diamond-like carbon layer 3. Thus, the first interlayer 2 must also have the property of providing a barrier to diffusion of alkali metals and additives from the parent substrate 1 to the diamond-like carbon layer 3. In the preferred embodiment form of the invention, the first interlayer comprises silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof, and chemically bonded combinations thereof. By the term "oxide", it is intended to mean a stoichiometrically oxidized material, or a partially oxidized material which contains excess metal atoms, or is deficient in oxygen. By the term "nitride", it is intended to mean a material composed of a stoichiometric amount of nitrogen or a material which either contains excess nitrogen atoms, or is deficient in nitrogen. By the term "carbide", it is intended to mean a material composed of a stoichiometric amount of carbon or a material which either contains excess carbon atoms, or is deficient in carbon.

By the term "chemically bonded combinations" it is intended to mean a combination of at least two of the foregoing materials which are joined by chemical bonds, e.g. silicon oxide and silicon nitride to form silicon oxynitride.

In the case of a single interlayer, first interlayer 2 rages from approximately 1 μm to 20 μm in thickness. Preferably, the first interlayer 2 is from about 5 Å thick to about 1 μm in those cases in which there are at least one other interlayer.

Following deposition of the first interlayer 2 onto the parent substrate 1, the diamond-like carbon layer 3 is chemically vapor deposited onto the coated substrate. The diamond-like carbon layer 3 can be from 10 Å to 20 μm in thickness. Preferably, the diamond-like carbon layer 3 is at least 50 Å thick.

To further enhance the abrasion wear resistance of the structure, more than one interlayer or a plurality of alternating interlayers and diamond-like carbon layers 3 may be deposited onto the parent substrate 1. It has been found that this arrangement allows for the deposition of a greater total thickness of DLC material, which provides a further increase in abrasion resistance. Thus, in further envisioned embodiments of the invention, not shown, the structure may comprise a parent substrate 1, two different and separately deposited first interlayers 2 and a diamond-like carbon layer 3; or a parent substrate 1 and two or more pairs of first interlayers 2 and diamond-like carbon layers 3.

It has unexpectedly been found that in severe wear environments, the abrasion resistance of the coated substrate product can be dramatically improved by using a relatively thick, e.g. in the range of about 1 μm to about 20 μm, first interlayer 2 between parent substrate 1 and DLC layer 3. Such a highly abrasion wear resistant and corrosion resistant coated substrate product is obtained by depositing such a relatively thick film of at least one interlayer 2 having a hardness greater than that of substrate 1 and then depositing a comparatively thin, e.g. at least 50 Å, layer of DLC as the top coat. In addition to serving as the bonding layers between substrate 1 and DLC top layer 3, interlayer(s) 2 provide a hard "structural support layer" for DLC layer 3. The thinner DLC top most layer provides a low friction, corrosion-resistant, protective surface for the substrate. The resulting coated substrate product has greater commercial utility than similar products in which the substrate is deposited with thin interlayer(s) 2 followed by a relatively thick DLC layer 3 in the following two cases. The first case is if the optical absorption coefficient of DLC layer 3 is too high to allow a thick DLC layer to be deposited while simultaneously meeting stringent optical transparency requirements for the coated product. The second case is if the deposition rate of DLC layer 3 is much lower than that of interlayer(s) 2, using a thick interlayer 2 to achieve the required degree of abrasion resistance is more economical than using a thick DLC layer 3.

In another embodiment of the invention, as illustrated in FIG. 2, a second interlayer 4 is chemically vapor deposited onto the coated substrate and positioned such that the second interlayer 4 is disposed between the first interlayer 2 and the diamond-like carbon layer 3. The second interlayer 4 would similarly comprise a substantially optically transparent material devoid of alkali metal atoms and fluorine, and capable of forming a strong chemical bond to the first interlayer 2 and the diamond-like carbon layer 3. The second interlayer may comprise a substantially optically transparent silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof, and chemically bonded combinations thereof.

Since the second interlayer 4 provides a diffusion barrier for alkali metal atoms, fluorine and/or any additional additives which would adversely effect the adherence of the diamond-like carbon layer 3, the first interlayer could further comprise a substantially optically transparent aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, cerium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof, and chemically bonded combinations thereof.

The second interlayer 4 can be from 5 Å to 20 µm in thickness. Preferably, second interlayer 4 is at least 10 Å thick. Still more preferably, second interlayer 4 has a thickness in the range of 1 µm to 20 µm in the case in which the thickness of first interlayer(s) 2 is in the 5 Å to 1 µm range to achieve the unexpected results of greatly improved abrasion resistance in severe wear environments for the coated substrate product.

The second interlayer 4 may alternatively comprise a substantially optically transparent metallic material capable of reflecting visible light and capable of forming a strong chemical bond with the first interlayer 2 and the diamond-like carbon layer 3, selected from the following two groups. In the first group, the metallic material may consist of silicon, germanium, hafnium, molybdenum, tungsten, yttrium, tantalum, titanium and zirconium. These metallic materials all form a strong chemical bond to the diamond-like carbon layer 3.

The second group of metallic materials comprises vanadium, niobium, chromium, manganese, then lure, technetium, iron, cobalt, iridium, rhodium, nickel, palladium, platinum, copper, silver, gold, zinc, ruthenium, indium, aluminum, tin, osmium, thallium, lead, antimony, bismuth and polonium. Among the second group of metallic materials, rhenium, iridium, tin, indium, aluminum, nickel, iron, chromium, copper, gold, silver and platinum are preferable as second interlayer 4. Although these materials will provide a diffusion barrier to alkali metal atoms and fluorine, they will not form a strong carbide bond with the diamond-like carbon layer 3. Therefore, if any of these second group metallic materials are selected for the second interlayer 4, a third interlayer (not shown) must be disposed between the second interlayer 4 and the diamond-like carbon layer 3. The third interlayer would similarly comprise a substantially optically transparent material devoid of alkali metal atoms and fluorine and selected from the group consisting of silicon nitride, titanium nitride, tantalum nitride, hafnium nitride, zirconium nitride, boron nitride, yttrium oxide, geranium oxide, hafnium oxide, silicon oxide, silicon dioxide, tantalum oxide, titanium oxide, zirconium oxide, silicon carbide, geranium carbide, mixtures thereof, and chemically bonded combinations thereof. Although it is not necessary, this third interlayer may be employed with the aforementioned first group of metallic materials.

The metallic second interlayer 4 can be from 5 Å to 1000 Å in thickness. Preferably, the metallic second interlayer 4 is at least 10 Å thick.

In yet another embodiment of the invention, as illustrated in FIG. 3, the embodiment illustrated in FIG. 2 and discussed above is provided with a second composite layer comprising a first interlayer 2 and a diamond-like carbon layer 3. The resultant multilayer structure would thus be a parent substrate 1, a first interlayer 2, a second interlayer 4, a diamond-like carbon layer 3, a first interlayer 2 and a diamond-like carbon layer 3. The structure may alternatively comprise a parent substrate 1, two first interlayers 2, a diamond-like carbon layer 3, a first interlayer 2 and a diamond-like carbon layer.

By choosing the appropriate interlayer 2, 4 and diamond-like carbon layer 3 thicknesses, criteria which are known in the art of optical coating design could be employed in each of the aforementioned embodiments of the present invention to produce quarter wavelength stacks and other "dielectric stack" coating configurations. In these dielectric stack configurations, optical interference effects could be used to produce wavelength-selective mirrors or anti-reflection films. By choosing the appropriate thickness of at least one of the interlayers 2, 4 and diamond-like carbon layer 3, the reflection of light at predetermined wavelength ranges may be either minimized or maximized. Superior abrasion wear resistance and environmental durability currently unavailable with conventional optical coatings could thus be realized by the incorporation of the dielectric stack configurations into the present invention.

The method of the present invention teaches those skilled in the art how to fabricate the transparent abrasion wear resistant coated substrate product. According to the method, the first step involves chemically de-greasing the surface of the parent substrate 1. The substrate 1 is then placed into a chemical vapor deposition reactor vacuum chamber and the air evacuated from the chamber to less than approximately $5 \times 10^{-6}$ Torr.

In the next step the surface of the substrate 1 is sputter etched with energetic ions or atoms to assist in the removal of residual hydrocarbons, as well as alkali metals and other additives which are commonly present on the surface of the substrate materials, particularly glass. It has been found that the concentration of alkali metals (Na, Ca) at the surface of glass substrates was significantly reduced as a function of ion sputter-etching time and that increased sputter-etching time substantially improved the adhesion of the diamond-like carbon layer 3. [See Examples A–Z]. Therefore, it is concluded that the removal of alkali metals and other additives is essential to achieve a highly adherent interface between parent substrate 1 and the diamond like carbon layer 3.

The sputter-etching may be performed with a beam of inert gas ions, hydrogen ions or oxygen ions, a glow discharge or a plasma of inert gas, hydrogen or oxygen. In the preferred embodiment form of the invention, sputter-etching is performed with a beam of energetic gas ions at an energy of at least 200 eV.

Following the sputter-etching step one or more interlayers are chemically vapor deposited onto the parent substrate 1. During a first cycle any of the aforementioned conventional chemical vapor deposition methods may be employed to deposit the interlayers 2, 4 (FIG. 2 & 3). The deposition rate of each interlayer 2,4 is generally in the range of about 0.1–10 microns/hour. The total thickness of each interlayer can be in the range of about 5 Å to 20 µm. In the preferred embodiment of the invention, the thickness of at least one interlayer is in the range of about 1µm to 20 µm and the total thickness for each of the other interlayers is at least 10 Å.

After the chemical vapor deposition of one or more interlayers onto the parent substrate 1, a diamond-like carbon layer 3 is deposited onto the coated substrate. The diamond-like carbon layer 3 can be deposited by the following conventional methods: (i) direct ion beam deposition, dual ion beam deposition, glow discharge, RF-plasma, DC-plasma, or microwave plasma deposition from a carbon-containing gas or a carbon- containing vapor which can also be mixed with hydrogen, nitrogen-containing gases, oxygen containing gases and/or inert gas, (ii) electron beam evaporation, ion-assisted evaporation, magnetron sputtering, ion beam sputtering, or ion-assisted sputter deposition from a solid carbon target material, or (iii) combinations of (i) and (ii).

In the preferred embodiment form of the invention, the diamond-like carbon layer(s) is deposited by ion beam deposition from a hydrocarbon gas or carbon vapor. The ion beam deposition may also be performed in combination with an inert gas or hydrogen.

The deposition rate of the diamond-like carbon layer 3 is generally in the range of about 0.1–10 microns/hour. The total thickness of the diamond-like carbon layer is generally in the range of about 10 Å to 20 µm. Preferably, the thickness of the diamond-like carbon layer 3 is at least 50 Å thick.

After the deposition of the appropriate interlayers and diamond-like carbon layer(s) 3, as detailed in the aforementioned embodiments. The coated substrate product is cooled by extinguishing the deposition process and passing an inert gas over the substrate until it has reached substantially room temperature. The coated substrate product, exhibiting superior abrasion wear resistance, is then removed from the reactor.

The examples which follow illustrate the superior performance of the invention. The examples are for illustrative purposes only and are not meant to limit the scope of the claims in any way.

EXAMPLE A

A 2"×2"×0.375" thick float glass plate was cut from a glass bar code scanner window and coated by the following procedure. The glass plate was chemically cleaned by trichloromethane followed by methanol solvents in an ultrasonic bath. The sample was removed and blown dry with nitrogen gas. The glass plate was then mounted onto a substrate holder and part of the substrate surface was masked. The sample was then inserted into a vacuum chamber which was then evacuated to $8\times10^{-7}$ Torr. The sample was sputter-etched for 1 minute by a beam of $Ar^+$ ions at an energy of 500 eV and a current density of 0.5 mA/cm$^2$. The sample was then coated by direct ion beam deposition using an 11 cm ion beam source operated on CH$_4$ gas at a pressure of $7.2\times10^{-5}$ Torr. The ion energy was 75 eV and the ion beam current density was 0.30 mA/cm$^2$. A transparent coating of 3000 Å thickness was deposited. The sample was removed and scratch-tested by rubbing a sharp piece of glass or a glass jar across the interface between the coated and uncoated (masked) areas. While the uncoated area showed deep and wide scratches, no scratches were observed on the DLC-coated area. The coating was tested for adhesion by alternately immersing the sample in baths of boiling water (for 2 minutes) and ice water (for 2 minutes). After one thermal cycle, the coating peeled off of the glass substrate.

EXAMPLE B

A 2"×2"×0.375" thick float glass plate was chemically cleaned, mounted, masked, and ion sputter-etched in vacuum for 10 minutes by the procedure described in Example A. Next, a 100-Å thick layer of SiO$_2$ was deposited onto the glass plate by $Ar^+$ ion beam sputter deposition from a quartz target. Then, a diamond-like carbon layer of 3,000 Å thickness was deposited by the method described in Example A. The coating could not be scratched when rubbed by a sharp piece of glass or a glass jar. The coating remained adherent after 5 thermal cycles between boiling water and ice water.

EXAMPLE C

A 2"×2"×0.375" thick float glass plate was chemically cleaned, mounted, masked, and ion sputter- etched in vacuum by the procedure described in Example B. Next, a 1,000-Å thick layer of SiO$_2$ was deposited onto the glass plate by $Ar^+$ ion beam sputter deposition from a quartz target. Then, a diamond-like carbon layer of 3,000 Å thickness was deposited by the method described in Example A. The coating could not be scratched when rubbed by a sharp piece of glass or a glass jar. The coating remained adherent after 5 thermal cycles between boiling water and ice water.

EXAMPLE D

A 2"×2"×0.375" thick float glass plate was chemically cleaned, mounted, masked, and ion sputter-etched in vacuum by the procedure described in Example B. Next, the coating described in Example B was repeated three times in sequence, so the total coating thickness deposited onto the glass plate was 9,300 Å. The coating could not be scratched when rubbed by a sharp piece of glass or a glass jar. The coating remained adherent after 5 thermal cycles between boiling water and ice water.

EXAMPLE E

A 2"×2"×0.375" thick float glass plate was chemically cleaned, mounted, masked, and ion sputter-etched in vacuum by the procedure described in Example A, except the sputter-etching time was 5 minutes. Next, a 800 Å thick layer of Al$_2$O$_3$ was deposited onto the glass plate by $Ar^+$ ion beam sputter deposition from an aluminum oxide target. Then, a diamond-like carbon layer of 200 Å thickness was deposited by the method described in Example A. The coating could not be scratched when rubbed by a sharp piece of glass. After 24 hours, the coating peeled off the substrate.

EXAMPLE F

A 1" diameter×0.06" thick soda lime glass disk was chemically cleaned, mounted, masked, and ion sputter-etched in vacuum by the procedure described in Example A. Next, a 10,000 Å thick layer of $Al_2O_3$ was deposited onto the glass plate by $Ar^+$ ion beam sputter deposition from an aluminum oxide target. Then, a 300-Å thick layer of $SiO_2$ was deposited over the $Al_2O_3$ layer by $Ar^+$ ion beam sputter deposition from a quartz target. Next, a diamond-like carbon layer of 200 Å thickness was deposited by the method described in Example A. The coating could not be scratched when rubbed by a sharp piece of glass. After 5 thermal cycles between boiling water and ice water, the coating remained adherent.

EXAMPLE G

A 6"×6"×0.375" thick float glass plate was initially coated with about 2,000 Å of $SnO_2$ by thermally activated deposition from an organo-tin compound. The plate was then chemically cleaned by the procedure described in Example A, mounted, masked, and installed into a vacuum chamber which was then evacuated to $3.5 \times 10^{-6}$ Torr. The sample was sputter-etched for 2 minutes by a beam of $Ar^+$ ions at an energy of 500 eV and a current density of 0.5 mA/cm². Next, a 1,000-Å thick layer of $SiO_2$ was deposited over the $SnO_2$ layer by $Ar^+$ ion beam sputter deposition from a quartz target. Then, a diamond-like carbon layer of 2,000 Å thickness is deposited by the method described in Example A. After 5 thermal cycles between boiling water and ice water, the coating remained adherent.

EXAMPLE H

A 6"×6"×0.375" thick float glass plate coated with about 2,000 Å of $SnO_2$ was chemically cleaned by the procedure described in Example A, mounted, masked, and installed into a vacuum chamber which was then evacuated to $6 \times 10^{-7}$ Torr. The sample was sputter-etched for 2 minutes by a beam of $Ar^+$ ions at an energy of 500 eV and a current density of 0.5 mA/cm². Then, a diamond-like carbon layer of 2,000 Å thickness was deposited by the method described in Example A. During deposition, the DLC coating began to peel off of the substrate, indicating poor adhesion.

EXAMPLE I

A 27 mm diameter×2 mm thick sapphire window was ultrasonically cleaned in trichloromethane, followed by acetone, and then methanol, and blown dry with nitrogen gas. The sapphire sample was mounted into the vacuum coating system and, after evacuation, sputter-etched for 3 minutes as described in Example A. Then, a 1000-Å thick layer of diamond-like carbon was deposited onto the sapphire substrate using the conditions described in Example A. A powdery carbon material was observed on the surface of the substrate upon removal from the coating chamber indicating that the coating was not adherent.

EXAMPLE J

A 27 mm diameter×2 mm thick sapphire window was cleaned, mounted into a vacuum coating system, evacuated, and sputter-etched for 1 minute using the conditions described in Example A. Then, a 100-Å thick layer of $SiO_2$ was deposited onto the sapphire substrate using the conditions described in Example B. Next, a transparent, 1000-Å thick layer of diamond-like carbon was deposited onto the sapphire substrate using the conditions described in Example A. The diamond-like carbon coating was very adherent, and could not be scratched with 50-micron quartz powder.

EXAMPLE K

A 27 mm diameter×2 mm thick sapphire window was cleaned, mounted into a vacuum coating system, evacuated, and sputter-etched for 1 minute using the conditions described in Example A. Then, a 50-Å thick layer of Si was deposited onto the sapphire substrate by $Ar^+$ ion beam sputter deposition from a Si target. Next, a transparent, 1000-Å thick layer of diamond-like carbon was deposited onto the sapphire substrate using the conditions described in Example A. Subsequent optical spectroscopy analysis of the coating revealed that the Si layer had been converted into a transparent layer of SiC by this process. The diamond-like carbon coating was very adherent, and could not be scratched with 50-micron quartz powder.

EXAMPLE L

A 130 mm diameter×1 mm thick aluminosilicate disk was mounted into a vacuum coating system, evacuated, and sputter-etched for 5 minutes, using the conditions described in Example A. Then, a 100-Å thick layer of $SiO_2$ was deposited onto the aluminosilicate substrate using the conditions described in Example B. Next, a 150-Å thick layer of diamond-like carbon was deposited onto the aluminosilicate substrate using the conditions described in Example A. The coating was very adherent, and could not be scratched with a sharp piece of glass.

EXAMPLE M

A 5.5"×5.5"×0.18" thick plate of Corning Code #9984-Pyroceram® (Note: Pyroceram®is a glass/ceramic material composed at least of rutile, aluminum oxide, and magnesium silicate.) was cleaned in isopropyl alcohol, blown dry with nitrogen gas, mounted into a vacuum coating system, evacuated, and sputter-etched for 15 minutes using the conditions described in Example A. Then, a 200-Å thick layer of $SiO_2$ was deposited onto the substrate as described in Example B. Next, a transparent, 2000-Å thick layer of diamond-like carbon was deposited onto the substrate using the conditions described in Example A. The coating was very adherent, and could not be scratched by a sharp piece of glass.

EXAMPLE N

A 5.5"×5.5"×0.18" thick plate of borosilicate glass was cleaned in isopropyl alcohol, blown dry with nitrogen gas, mounted into a vacuum coating system, evacuated, and sputter-etched for 15 minutes using the conditions described in Example A. Then, a 200-Å thick layer of $SiO_2$ was deposited onto the substrate as described in Example B. Next, a transparent, 2000-Å thick layer of diamond-like carbon was deposited onto the substrate using the conditions described in Example A. The coating was very adherent, and could not be scratched by a sharp piece of glass.

EXAMPLE O

A 2"×2"×¼" thick piece float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 100-Å thick layer of $SiO_2$ was deposited onto the substrates using the conditions described in Example B. Next, a 100-Å thick layer of Si was deposited on top of the $SiO_2$ layer by $Ar^+$ ion beam sputter deposition from a Si target. Finally, a 1,000-Å thick layer of transparent diamond-like carbon was deposited on top of the Si layer using the conditions described in Example A. The coating was very adherent, and could not be scratched with a sharp piece of glass which could easily scratch the un-coated glass substrates. The coating on the sunglass lens exhibited an intense blue-purple reflected color.

EXAMPLE P

A 2"×2"×¼ thick piece of float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 100-Å thick layer of $SiO_2$ was deposited onto the substrates using the conditions described in Example B. Next, a 100-Å thick layer of Cr metal was deposited by $Ar^+$ ion beam sputter deposition from a Cr target. Next, a second 100-Å thick layer of $SiO_2$ was deposited on top of the Cr layer. Finally, a 1,000-Å thick layer of transparent diamond-like carbon was deposited on top of the $SiO_2$ layer using the conditions described in Example A. The coating was very adherent, and could not be scratched with a sharp piece of glass which could easily scratch the un-coated glass substrates. The coating on the sunglass lens exhibited a bright blue reflected color.

EXAMPLE Q

An adherent, abrasion-resistant quarter-wavelength stack reflecting coating was formed on glass substrates. The layer thicknesses were chosen to maximize reflectance at a wavelength of 450 nanometers. The refractive index of the deposited $SiO_2$ layers was about 1.5, and the refractive index of the deposited DLC layers was about 2.05. The coating was formed as follows:

A 2"×2"×¼ thick piece of float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 750-Å thick layer of $SiO_2$ was deposited onto the substrates using the conditions described in Example B. Next, a 555-Å thick layer of transparent diamond-like carbon was deposited on top of the first $SiO_2$ layer using the conditions described in Example A. Next, a 750-Å thick layer of $SiO_2$ was deposited on top of the first DLC layer using the conditions described in Example B. Finally, a 550-Å thick layer of transparent diamond-like carbon was deposited on top of the second $SiO_2$ layer using the conditions described in Example A. The coating was very adherent, and could not be scratched with a sharp pie of glass which could easily scratch the un-coated glass substrates. The coating exhibited a light yellow-blue reflected color on the sunglass lens, and a light blue reflected color on the glass plate.

EXAMPLE R

A 5.7"×5.7"×0.375" soda-lime, float glass plate was cleaned with soap and water followed by rinsing with isopropanol and drying with nitrogen gas. The glass plate was mounted onto a substrate holder which was in a vacuum chamber. The vacuum chamber was then evacuated to a pressure of $5 \times 10^{-6}$ Torr. Next, the sample was sputter-etched for 10 minutes with a beam of $Ar^+$ ions at an energy of 500 eV and a current density of 0.5 $mA/cm^2$. A 3000-Å layer of $SiO_2$ was then deposited by ion beam sputter deposition by bombarding a silica target with a beam of $N_2^+$ ions. Next a 1-micron layer of "silicon oxy-nitride" was deposited onto the glass plate by bombarding a Si target with a beam of $N_2^+$ ions in the presence of air. After deposition of the silicon oxy-nitride, a 100 Å thick layer of diamond-like carbon was deposited using a 11 cm ion beam source operated on methane gas at a pressure of $1.4 \times 10^{-4}$ Torr. The beam energy was 75 eV and the beam current density was 0.3 $mA/cm^2$. The coating was very adherent to the glass substrate.

EXAMPLE S

A 5.7"×5.7"×0.375" float glass substrate was cleaned and mounted in a vacuum chamber as in Example R. The chamber was evacuated to a pressure of $5 \times 10^{-6}$ Torr. The sample was ion beam sputter-etched as in Example R. Next, a 3000-Å $SiO_2$ layer was deposited as in Example R. Then, a 2-micron silicon oxy-nitride layer silicon oxy-nitride layer was deposited as described in Example R. Finally, a 100-Å DLC layer was deposited as in Example R. The coating was very adherent to the glass substrate.

EXAMPLE T

A 5.7"×5.7"×0.375" float glass substrate was cleaned and mounted in a vacuum chamber as in Example R. The chamber was evacuated to $4 \times 10^{-6}$ Torr. The sample was ion beam sputter-etched as in Example R. Next, a 3000-Å $SiO_2$ layer was deposited as in Example R. Then, a 3-micron silicon oxy-nitride layer was deposited as described in Example R. Finally, a 100-Å DLC layer was deposited as in Example R. The coating was very adherent to the glass substrate.

EXAMPLE U 5.7"×5.7"×0.375" float glass substrate was cleaned and mounted in a vacuum chamber as in Example R. The chamber was evacuated to $4 \times 10^{-6}$ Torr. The sample was ion beam sputter-etched as in Example R. Next, a 3,000-Å $SiO_2$ layer was deposited as in Example R. Then, a 4-micron silicon oxy-nitride layer was deposited as described in Example R. A 100-Å DLC layer was deposited as in Example R. The coating was very adherent to the glass substrate.

EXAMPLE V

Four neutral gray tempered sunglass lenses were cleaned by the chemical cleaning procedure used in Example R. The lenses were subsequently mounted onto a graphite plate. One-half of the surface was masked. The graphite plate was then mounted in a vacuum chamber and the chamber was evacuated to $5 \times 10^{-6}$ Torr. The lenses were $Ar^+$ ion beam sputter-etched as in Example R. Then, a 3000-Å $SiO_2$ layer was deposited as in Example R. Next a 0.5-micron silicon oxy-nitride layer was deposited as in Example R. Finally, a 200-Å DLC layer was deposited as in Example R. The coating was very adherent to the sunglass lenses.

EXAMPLE W

Four tempered sunglass lenses were cleaned, mounted, and masked as in Example V. The graphite plate was then mounted in a vacuum chamber and the chamber was evacuated to $2\times10^{-6}$ Torr. The lenses were $Ar^+$ ion beam sputter-etched as in Example R. A 3000Å $SiO_2$ layer was deposited as in Example R. A 1 micron silicon oxy-nitride layer deposited as in Example R. A 200-Å DLC layer was deposited as in Example R. The coating was very adherent to the sunglass lenses.

EXAMPLE X

Four tempered sunglass lenses were cleaned, mounted, and masked as in Example W. The graphite plate was then mounted in a vacuum chamber and the chamber was evacuated to $4\times10^{-6}$ Torr. The lenses were $Ar^+$ ion beam sputter-etched as in Example R. Next, a 3000-Å, $SiO_2$ layer was deposited as in Example R. A 2-micron silicon oxy-nitride layer was deposited as in Example R. A 200-Å, DLC layer was deposited as in Example R. The coating was very adherent to the sunglass lenses.

EXAMPLE Y

Four tempered sunglass lenses were prepared and coated as in Example X except the silicon oxy-nitride thickness was increased to 3 microns. The coating was very adherent to the sunglass lenses.

EXAMPLE Z

Four tempered sunglass lenses were prepared and coated as in Example V except the silicon oxy-nitride thickness was increased to 4 microns. The coating was very adherent to the sunglass lenses.

Specific examples of the use of thick interlayer(s) 2 with a thin DLC layer 3 were shown in Examples R-Z. In these Examples, the coated substrate products are supermarket laser bar code scanner windows designed to stop damage from impacting cans and bottles for a period of at least five years, and glass sunglass lenses designed to withstand severe abrasion by sand. In Examples R-Z, the glass substrates were coated with a first interlayer 2 of silicon dioxide, a second interlayer 2 of a chemical combination of silicon oxide and silicon nitride (so-called "silicon oxy-nitride") and finally a top layer of DLC. The silicon dioxide layer was several thousands of Å thick, the "silicon oxy-nitride" layer ranged in thickness from 0.5 micron to four microns, and the DLC layer thickness was 100 Å or 200 Å. In severe tests, the abrasion resistance was found to increase dramatically with the thickness of the silicon oxy-nitride interlayer.

Figure 4:
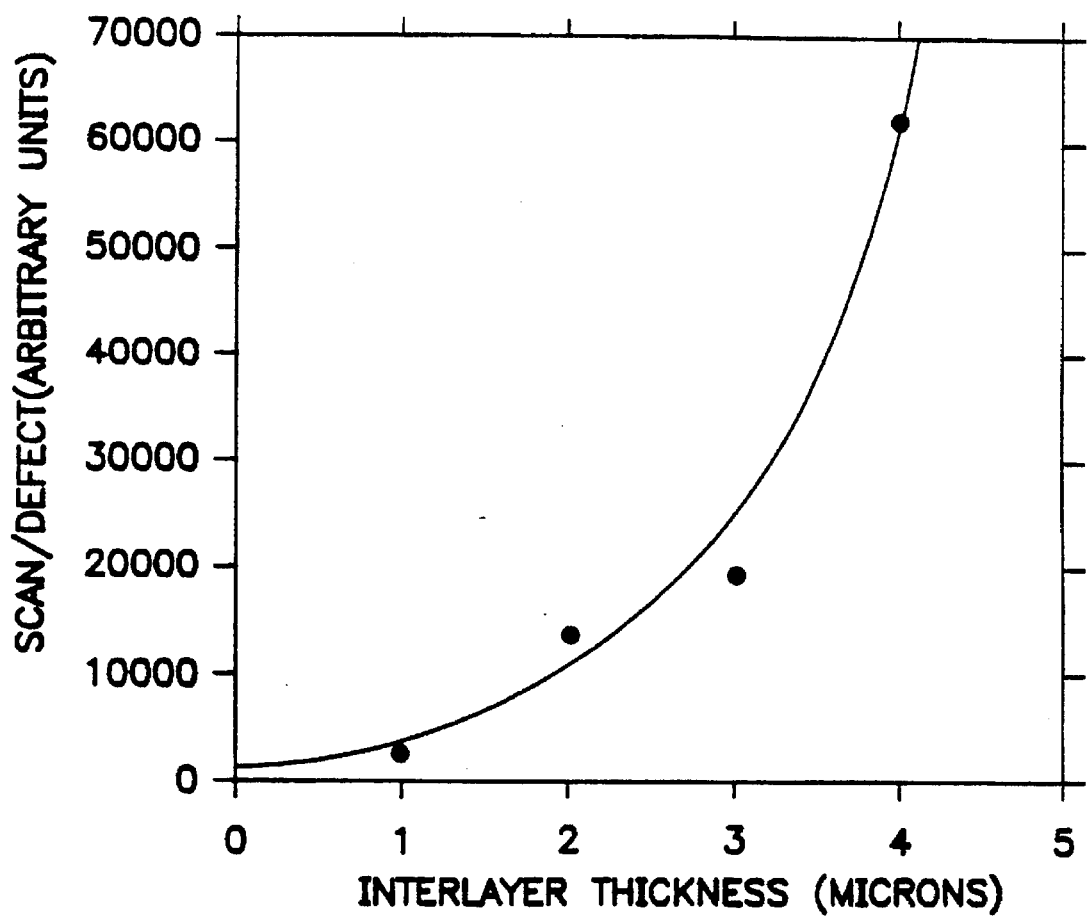
FIG. 4 is a graph of the ratio of scans per defect versus the interlayer thickness of the coating of a coated bar-code scanner window product in accordance with the present invention.

One particular example of the effect of the interlayer thickness on abrasion resistance is shown in FIG. 4. FIG. 4 shows results obtained from a Tagucchi study of diamond-like carbon coated bar-code scanner windows used in grocery stores. One of the parameters investigated in this study was the thickness of an interlayer of silicon oxy-nitride deposited onto a $SiO_2$ interlayer which in turn was deposited onto a soda-lime float glass substrate. A 100 Å thick layer of DLC was deposited onto the silicon oxy-nitride (see Examples R-U). These coated windows were installed into a grocery store bar code scanner in which the number of items scanned over each window was recorded. At the end of the test, the windows were removed and the number of scratches visible to the unaided eye were counted. FIG. 4 is a plot of the number of items scanned across each window divided by the number of scratches observed on the window at the end of the test. It is desirable to increase the number of scans/defect in order to increase the lifetime of the window. FIG. 4 shows that increasing the silicon oxy-nitride layer from one to four microns thickness dramatically improves the abrasion resistance.

Analogous results were obtained for a similar coating structure on glass sunglass lenses. Lenses were produced with silicon oxy-nitride interlayers of 0.5, 1, 2, 3 and 4 microns thickness (see Examples V–Z). These lenses were then scratched with #2 quartz particles under an applied pressure of 33 pounds per square inch. This test simulates severe sand abrasion. For a silicon oxy-nitride thickness of 0.5 microns (Example V) significant damage to the substrate was observed. As the silicon oxy-nitride thickness was increased to 1 micron (Example W), the number of scratches penetrating the coating decreased dramatically, but a significant number of fine scratches which indented the substrate through the coating, but did not break through the coating, were observed using an optical microscope. At a thickness of 2 microns (Example X), scratches which punctured the coating were not observed, but some indentation type scratches still occurred. At thicknesses of 3 and 4 microns (Example Y and Z, respectively) no indication of any type of scratch was observed by optical microscopy.

Examples R–Z showed that in severe abrasion tests, the abrasion resistance of the coated substrate product increases dramatically with the thickness of a hard, silicon oxy-nitride interlayer. These tests also demonstrate that the coating thickness required to achieve the desired degree of abrasion resistance is application specific.

From the foregoing description, one of ordinary skill in the art can easily ascertain that the present invention provides a novel method for producing a substantially optically transparent multilayer composite structure. A highly important technical advantage of the invention is that superior abrasion wear resistance is achieved by use of a multilayer transparent structure comprised of a parent substrate, one or more interlayers and a diamond-like carbon outer layer.

Without departing from the spirit and scope of this invention, one of ordinary skill can make various changes and modifications to the invention to adapt it to various usages and conditions. As such, these changes and modifications are properly, equitably, and intended to be, within the full range of equivalents of the following claims.

What is claimed is:

1. A chemical vapor deposition method for producing an abrasion wear resistant coated substrate product comprising:

chemically de-greasing the surface of a parent substrate which is substantially optically transparent to light in the visible region of 350 to approximately 750 nanometers and which comprises a material selected from the group consisting of an amorphous material, a single crystal, polycrystalline materials, ceramic materials and mixtures thereof to remove hydrocarbon contamination;

placing said substrate into a chemical vapor deposition reactor vacuum chamber and evacuating the air from said chamber;

sputter-etching the surface of said substrate with energetic gas ions to remove traces of residual hydrocarbon and to preferentially reduce the concentration of alkali metal atoms and alkali metal oxides at the substrate surface;

chemically vapor depositing at least one composite layer having a thickness in the range of about 1 μm to about 20 μm by chemically vapor depositing during a first cycle a substantially optically transparent first interlayer at least 1 μm up to 20 μm, thick onto said substrate;

chemically vapor depositing during said first cycle a substantially optically transparent diamond-like carbon outer layer which is transparent to light in the visible region of 350 to approximately 750 nanometers and having a thickness of at least 50 Å thick onto said coated substrate;

said first interlayer comprising a substantially optical transparent material devoid of alkali metal atoms and fluorine, which first interlayer is transparent to light in the visible region of 350 to approximately 750 nanometers and is selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof, and chemically bonded combinations thereof to form a strong chemical bond to said substrate and a strong chemical bond to said diamond-like carbon outer layer;

cooling said coated substrate by extinguishing said deposition process and passing an inert gas over said substrate until the temperature of said substrate has reached substantially room temperature during said cool-down step; and recovering a coated substrate product exhibiting greatly improved wear resistance for severe abrasive environments.

2. The method of claim 1 wherein the thickness of said first interlayer and said diamond-like carbon outer layer are selected to maximize the reflection of light.

3. The method of claim 1 wherein the thickness of said diamond-like carbon layer corresponds to integer multiples of quarter wavelength optical thickness.

4. The method of claim 1 wherein the thickness of said first interlayer and said diamond-like carbon layer corresponds to integer multiples of quarter wavelength optical thickness.

5. The method of claim 1 wherein said composite layer comprises said first interlayer toward said substrate, a second interlayer which is transparent to light in the visible region of 350 to approximately 750 nanometers disposed immediately adjacent to said first interlayer and away from said substrate of a substantially optically transparent material devoid of alkali metal atoms and fluorine and capable of forming a strong chemical bond to said first interlayer and a strong chemical bond to diamond-like carbon, and said diamond-like carbon outer layer disposed immediately adjacent to said second interlayer and away from said substrate.

6. The method of claim 5 wherein said second interlayer comprises a substantially optically transparent metallic material capable of reflecting visible light selected from the group consisting of silicon, germanium, hafnium, molybdenum, tungsten, yttrium, tantalum, titanium and zirconium.

7. The method of claim 6 wherein the thickness of said first interlayer is in the range of about 5 Å to about 20 μm and the thickness of said second interlayer is in the range of about 10 Å to about 1000 Å.

8. The method of claim 5 wherein said second interlayer comprises a substantially optically transparent metallic material capable of reflecting visible light selected from the group consisting of vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium.

9. The method of claim 8 wherein the thickness of said first interlayer is in the range of about 5 Å to about 20 μm and the thickness of said second interlayer is in the range of about 10 Å to about 1000 Å.

10. The method of claim 8 including a third interlayer disposed between said second interlayer and said diamond-like carbon outer layer of a substantially optically transparent material which third interlayer is transparent to light in the visible region of 350 to approximately 750 nanometers and is devoid of alkali metal atoms and fluorine to form a strong chemical bond with said second interlayer and said diamond-like carbon outer layer.

11. The method of claim 10 wherein said third interlayer comprises a substantially optically transparent material selected from the group consisting of silicon nitride, titanium nitride, tantalum nitride, hafnium nitride, zirconium nitride, boron nitride, yttrium oxide, germanium oxide, hafnium, oxide, silicon oxide, silicon dioxide, tantalum oxide, titanium oxide, zirconium oxide, silicon carbide, germanium carbide, mixtures thereof, and chemically bonded combinations thereof.

12. The method of claim 11 wherein the thickness of said first interlayer, said third interlayer and said diamond-like carbon outer layer are selected to minimize the reflection of light.

13. The method of claim 11 wherein the thickness of at least one of said composite layers, said third interlayer and said diamond-like carbon outer layer is selected to maximize the reflection of light.

14. The method of claim 11 wherein the thickness of said third interlayer and said diamond-like carbon outer layer corresponds to integer multiples of quarter wavelength optical thickness.

15. The method of claim 11 wherein the thickness of said first interlayer, said third interlayer and said diamond-like carbon outer layer corresponds to integer multiples of quarter wavelength optical thickness.

16. The method of claim 10 wherein said composite layer includes a chemically vapor deposited fourth interlayer disposed between said second interlayer and said diamond-like carbon outer layer of a substantially optically transparent material devoid of alkali metal atoms and fluorine to form a strong chemical bond to said second interlayer and said diamond-like carbon outer layer.

17. The method of claim 16 wherein said first interlayer and said second interlayer comprise a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof and chemically bonded combinations thereof.

18. The method of claim 16 wherein said fourth interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof and chemically bonded combinations thereof.

19. The method of claim 18 wherein the thicknesses of said first and second interlayers are in the range of about 5 Å to about 1 μm and the thickness of said fourth interlayer is in the range of about 1 μm to about 20 μm.

20. The method of claim 16 wherein the thickness of said first interlayer said second interlayer, said fourth interlayer and said diamond-like carbon outer layer are selected to minimize the reflection of light.

21. The method of claim 16 wherein the thickness of said first interlayer, said second interlayer, said fourth interlayer, and said diamond-like carbon outer layer are selected to maximize the reflection of light.

22. The method of claim 16 wherein the thickness of said second interlayer, said fourth interlayer and said diamond-like carbon layer corresponds to integer multiples of quarter wavelength optical thickness.

23. The method of claim 16 wherein the thickness of said first interlayer, said second interlayer, said fourth interlayer and said diamond-like carbon layer corresponds to integer multiples of quarter wavelength optical thickness.

24. The method of claim 5 wherein said first interlayer further comprises a substantially optically transparent material selected from the group consisting of aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof and chemically bonded combinations thereof.

25. The method of claim 5 wherein said second interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof and chemically bonded combinations thereof.

26. The method of claim 25 wherein the thickness of said first interlayer is in the range of about 5 Å to about 1 μm and the thickness of said second interlayer is in the range of about 1μm to about 20 μm.

27. The method of claim 26 wherein said first interlayer comprises silicon dioxide and said second interlayer comprises a chemically bonded combination of silicon oxide and silicon nitride.

28. The method of claim 21 wherein the thickness of said diamond-like carbon outer layer is at least 50 Å thick.

29. The method of claim 25 wherein the thickness of said first layer, said second interlayer and said diamond-like carbon outer layer are selected to minimize the reflection of light.

30. The method of claim 25 wherein the thickness of said first interlayer, said second interlayer and said diamond-like carbon outer layer are selected to maximize the reflection of light.

31. The method of claim 25 wherein the thickness of said second interlayer and said diamond-like carbon outer layer corresponds to integer multiples of quarter wavelength optical thickness.

32. The method of claim 25 wherein the thickness of said first interlayer, said second interlayer and said diamond-like carbon layer corresponds to integer multiples of quarter wavelength optical thickness.

33. The method of claim 25 wherein said composite layer comprises two different and separately deposited interlayers in place of said second interlayer and said diamond-like carbon outerlayer disposed immediately adjacent to the plurality of said interlayers and wherein each of said plurality of interlayers comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof and chemically bonded combinations thereof.

34. The method of claim 5 wherein said first interlayer further comprises a substantially optically transparent material selected from the group consisting of aluminum oxide, silicon oxide, silicon dioxide, silicon nitride, mixtures thereof and chemically bonded combinations thereof, and said second interlayer comprises substantially optically transparent silicon oxy-nitride.

35. The method of claim 34 wherein the substrate is a bar code scanner window.

36. The method of claim 34 wherein said first interlayer is about 10 Å to 1 μm thick.

37. The method of claim 34 wherein said second interlayer is about 1 μm to 20 μm thick.

38. The method of claim 37 wherein said first interlayer is aluminum oxide.

39. The method of claim 37 wherein said first interlayer is silicon dioxide.

40. The method of claim 37 wherein said first interlayer is silicon oxy-nitride and the atomic concentration of nitrogen in said second interlayer is greater than the atomic concentration of nitrogen in said first interlayer.

41. A chemical vapor deposition method for producing an abrasion wear resistant coated substrate product comprising:

chemically de-greasing the surface of a parent substrate which is substantially optically transparent to light in the visible region of 350 to approximately 750 nanometers and which comprises a material selected from the group consisting of an amorphous material, a single crystal, polycrystalline materials, ceramic materials and mixtures thereof to remove hydrocarbon contamination;

placing said substrate into a chemical vapor deposition reactor vacuum chamber and evacuating the air from said chamber;

sputter-etching the surface of said substrate with energetic gas ions to remove traces of residual hydrocarbon and to preferentially reduce the concentration of alkali metal atoms and alkali metal oxides at the substrate surface;

chemically vapor depositing a composite layer comprising a first composite having a thickness in the range of about 1 μm to about 20 μm and at least one second composite layer by chemically vapor depositing onto said substrate a first interlayer of a substantially optically transparent material to form a strong chemical bond to said substrate which first interlayer is transparent to light in the visible region of 350 to approximately 750 nanometers and which is selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof, and chemically bonded combinations thereof;

chemically vapor depositing a second interlayer onto and immediately adjacent to said first interlayer and away from said substrate of a substantially optically transparent material devoid of alkali metal atoms and fluorine to form a strong chemical bond to said first interlayer and a strong chemical bond to diamond-like carbon;

chemically vapor depositing a substantially optically transparent first diamond-like carbon layer which is transparent to light in the visible region of 350 to approximately 750 nanometers and having a thickness of at least 200 Å thick onto said coated substrate;

chemically vapor depositing onto and immediately adjacent to said first diamond-like carbon layer a third interlayer of a substantially optically transparent material devoid of alkali metal atoms and fluorine to form a strong chemical bond to diamond-like carbon;

chemically vapor depositing a second substantially optically transparent diamond-like carbon layer onto said third interlayer;

cooling said coated substrate by extinguishing said deposition process and passing an inert gas over said substrate until the temperature of said substrate has reached substantially room temperature during said cool-down step; and recovering a coated substrate product exhibiting greatly improved wear resistance for severe abrasive environments.

42. The method of claim 41 wherein said second interlayer and said third interlayer comprise a substantially optically transparent material selected from the group consisting of silicon nitride, titanium nitride, tantalum nitride, hafnium nitride, zirconium nitride, boron nitride, germanium oxide, hafnium oxide, silicon oxide, silicon dioxide, tantalum oxide, titanium oxide, yttrium oxide, zirconium oxide, silicon carbide, germanium carbide, mixtures thereof, and chemically bonded combinations thereof.

43. The method of claim 41 wherein the thickness of said second interlayer is in the range of about 1 μm to about 20 μm.

44. The method of claim 43 wherein the first interlayer comprises silicon dioxide and said second interlayer comprises a chemically bonded combination of silicon oxide and silicon nitride.

45. The method of claim 41 wherein said first composite layer comprises at least one pair of separately deposited said second interlayers.

46. The method of claim 41 wherein the thickness of said first interlayer, said second interlayer and said third interlayer is at least 2 μm thick.

47. The method of claim 41 wherein the thickness of said first diamond-like carbon layer and said second diamond-like carbon layer is at least 50 Å thick.

48. The method of claim 41 wherein the thickness of at least one of said first interlayer, said second interlayer, said third interlayer, said first diamond-like carbon layer and said second diamond-like carbon layer is selected to minimize the reflection of light.

49. The method of claim 41 wherein the thickness of at least one of said first interlayer, said second interlayer, said third interlayer, said first diamond-like carbon layer and said second diamond-like carbon layer is selected to maximize the reflection of light.

50. The method of claim 41 wherein the thickness of said second interlayer, said third interlayer, said first diamond-like carbon layer and said second diamond-like carbon layer corresponds to integer multiples of quarter wavelength optical thickness.

51. The method of claim 41 wherein the thickness of said first interlayer, said second interlayer, said third interlayer, said first diamond-like carbon layer and said second diamond-like carbon layer corresponds to integer multiples of quarter wavelength optical thickness.

52. The method of claim 44 wherein said third interlayer comprises a substantially optically transparent material selected from the group consisting of silicon nitride, titanium nitride, tantalum nitride, hafnium nitride, zirconium nitride, boron nitride, germanium oxide, hafnium oxide, silicon oxide, silicon dioxide, tantalum oxide, titanium oxide, yttrium oxide, zirconium oxide, silicon carbide, germanium carbide, mixtures thereof, and chemically bonded combinations thereof.

53. The method of claim 52 wherein said second interlayer comprises a substantially optically transparent metallic material capable of reflecting visible light selected from the group consisting of silicon, germanium, hafnium, molybdenum, tungsten, yttrium, tantalum, titanium and zirconium.

54. The method of claim 52 wherein the thickness of said first interlayer is in the range of about 5 Å to about 20 μm and the thickness of said second interlayer is in the range of about 10 Å to about 1000 Å.

55. The method of claim 52 wherein said second interlayer comprises a substantially optically transparent metallic material capable of reflecting visible light selected from the group consisting of vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium.

56. The method of claim 55 wherein the thickness of said first interlayer is in the range of about 5 Å to about 20 μm and the thickness of said second interlayer is in the range of about 10 Å to about 1000 Å.

57. The method of claim 55 including a fourth interlayer disposed between said second interlayer and said first diamond-like carbon layer of a substantially optically transparent material devoid of alkali metal atoms and fluorine to form a strong chemical bond with said second interlayer and said first diamond-like carbon layer.

58. The method of claim 57 wherein said fourth interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof, and chemically bonded combinations thereof.

59. The method of claim 57 wherein the thickness of at least one of said first interlayer, said fourth interlayer, said third interlayer, said first diamond-like carbon layer and said second diamond-like carbon layer is selected to maximize the reflection of light.

60. The method of claim 57 wherein the thickness of at least one of said first interlayer, said fourth interlayer, said third interlayer, said first diamond-like carbon layer and said second diamond-like carbon layer is selected to maximize the reflection of light.

61. The method of claim 57 wherein the thickness of said fourth interlayer, said third interlayer, said first diamond-like carbon layer and said second diamond-like carbon layer corresponds to integer multiples of quarter wavelength optical thickness.

62. The method of claim 57 wherein the thickness of said first interlayer, said fourth interlayer, said third interlayer, said first diamond-like carbon layer and said second diamond-like carbon layer corresponds to integer multiples of quarter wavelength optical thickness.

63. The method of claim 41 wherein said first composite layer includes a fifth interlayer disposed between said second interlayer and said first diamond-like carbon layer of a substantially optically transparent material devoid of alkali metal atoms and fluorine to form a strong chemical bond with said second interlayer and said diamond-like carbon outer layer.

64. The method of claim 63 wherein said third interlayer and said fifth interlayer comprise a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, mixtures thereof, and chemically bonded combinations thereof.

65. The method of claim 64 wherein the thickness of said first and second interlayers are at least about 5 Å and less than 20 μm and the thickness of said fifth interlayer is at least about 1 μm and less than 20 μm.

66. The method of claim 63 wherein said second interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide, mixtures thereof, and chemically bonded combinations thereof.

67. The method of claim 63 wherein the thickness of at least one of said first interlayer, said second interlayer, said fifth interlayer, said first diamond-like carbon layer, said third interlayer and said second diamond-like carbon layer is selected to minimize the reflection of light.

68. The method of claim 63 wherein the thickness of at least one of said first interlayer, said second interlayer, said fifth interlayer, said first diamond-like carbon layer, said third interlayer and said second diamond-like carbon layer is selected to maximize the reflection of light.

69. The method of claim 63 wherein the thickness of said second interlayer, said third interlayer, said fifth interlayer, said first diamond-like carbon layer and said second diamond-like carbon layer corresponds to integer multiples of quarter wavelength optical thickness.

70. The method of claim 63 wherein the thickness of said first interlayer, said second interlayer, said third interlayer, said fifth interlayer, said first diamond-like layer and said second diamond-like carbon layer corresponds to integer multiples of quarter wavelength optical thickness.

* * * * *

UNITED STATES PATENT AND TRADEMARK OFFICE
CERTIFICATE OF CORRECTION

PATENT NO. : 5,643,423
DATED : July 1, 1997
INVENTOR(S) : Fred M. Kimock, *et al.*

It is certified that error appears in the above-indentified patent and that said Letters Patent is hereby corrected as shown below:

Title page, under the title "FOREIGN PATENT DOCUMENTS", 2nd column, line 9, after "1006402" insert --A--.

In the Title, insert --WEAR-- between "ABRASION" and "RESISTANT".

Column 1, line 5, delete "this" and insert therefor --This--.

Column 1, line 7, delete "Dec. 3, 1993" and insert therefor --Dec. 7, 1993--.

Column 2, line 51, before "µm)" insert --(--.

Column 4, line 27, delete "rages" and insert therefor --ranges--.

Column 5, line 60, delete "then lure" and insert therefor --rhenium--.

Column 11, line 14, insert --"-- after "1/4".

Column 11, line 42, insert --"-- after "1/4".

Column 11, line 49, delete "555" and insert therefor --550--.

Column 11, line 58, delete "pie" and insert therefor --piece--.

Column 12, line 22, delete second occurrence of "silicon oxy-nitride layer".

Column 12, line 62, insert a space between "200-Å" and "DLC".

Column 16, line 19, delete "thickness" and insert therefor --thicknesses--.

Column 17, line 5, delete "thickness" and insert therefor --thicknesses--.

Column 17, line 6, insert --,-- after "interlayer".

Column 17, line 9, delete "thickness" and insert therefor --thicknesses--.

Column 17, line 50, delete "21" and insert therefor --27--.

UNITED STATES PATENT AND TRADEMARK OFFICE
CERTIFICATE OF CORRECTION

PATENT NO. : 5,643,423
DATED : July 1, 1997
INVENTOR(S) : Fred M. Kimock, *et al.*

It is certified that error appears in the above-indentified patent and that said Letters Patent is hereby corrected as shown below:

Column 17, line 52, delete "thickness" and insert therefor --thicknesses--.

Column 17, line 53, delete "layer" and insert therefor --interlayer--.

Column 17, line 56, delete "thickness" and insert therefor --thicknesses--.

Column 19, line 63, delete "41" and insert therefor --47--.

Column 20, line 15, delete "44" and insert therefor --41--.

Column 20, line 30, delete "52" and insert therefor --53--.

Column 20, line 64, delete "maximize" and insert therefor --minimize--.

Column 22, line 32, insert --carbon-- between "diamond-like" and "layer".

Column 6, line 11, delete "geranium" and insert therefor --germanium--.

Column 6, line 14, delete "geranium" and insert therefor --germanium--.

Column 7, line 48, delete period after "embodiments" and insert therefor --,--.

Column 7, line 51, after "temperature" delete "The" and insert therefor --the--.

Column 8, line 35, delete space between "sputter-" and "etched".

UNITED STATES PATENT AND TRADEMARK OFFICE
CERTIFICATE OF CORRECTION

PATENT NO. : 5,643,423
DATED : July 1, 1997
INVENTOR(S) : Fred M. Kimock, *et al.*

It is certified that error appears in the above-indentified patent and that said Letters Patent is hereby corrected as shown below:

Column 10, line 37, delete "." after "silicate" and before ")".

Column 12, line 40, insert --A-- before "5.7"".

Column 13, line 4, insert --was-- before "deposited".

Column 15, line 43, delete "and capable of forming" and insert therefor --to form--.

Signed and Sealed this

Twenty-sixth Day of May, 1998

*Attest:*

BRUCE LEHMAN

*Attesting Officer*    *Commissioner of Patents and Trademarks*